United States Patent
Diaz et al.

(10) Patent No.: US 9,905,751 B2
(45) Date of Patent: Feb. 27, 2018

(54) MAGNETIC TUNNEL JUNCTION WITH REDUCED DAMAGE

(71) Applicant: Taiwan Semiconductor Manufacturing Company, Ltd., Hsin-Chu (TW)

(72) Inventors: Carlos H. Diaz, Mountain View, CA (US); Harry-Hak-Lay Chuang, Singapore (SG); Ru-Liang Lee, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/757,582

(22) Filed: Dec. 24, 2015

(65) Prior Publication Data

US 2017/0110649 A1    Apr. 20, 2017

Related U.S. Application Data

(60) Provisional application No. 62/243,753, filed on Oct. 20, 2015.

(51) Int. Cl.
| | |
|---|---|
| H01L 21/00 | (2006.01) |
| H01L 27/22 | (2006.01) |
| H01L 29/82 | (2006.01) |
| H01L 43/02 | (2006.01) |
| H01L 43/08 | (2006.01) |
| H01L 43/12 | (2006.01) |
| H01L 21/302 | (2006.01) |

(52) U.S. Cl.
CPC ............ *H01L 43/02* (2013.01); *H01L 21/302* (2013.01); *H01L 27/222* (2013.01); *H01L 43/08* (2013.01); *H01L 43/12* (2013.01)

(58) Field of Classification Search
CPC ......... H01L 43/08; H01L 43/12; H01L 27/22; H01L 43/02; H01L 21/30
USPC ........ 257/421, 427, E21.665, 422, 247, 295, 257/797, E21.001, 21.211; 438/3
See application file for complete search history.

(56) References Cited

U.S. PATENT DOCUMENTS

| | | | |
|---|---|---|---|
| 6,784,091 B1 * | 8/2004 | Nuetzel ................. | B82Y 10/00 257/E21.577 |
| 8,869,436 B2 | 10/2014 | Tsai et al. | |
| 2005/0023581 A1 * | 2/2005 | Nuetzel ................. | B82Y 10/00 257/295 |
| 2005/0164413 A1 | 7/2005 | Meixner et al. | |

(Continued)

FOREIGN PATENT DOCUMENTS

| | | |
|---|---|---|
| KR | 20050085682 | 8/2005 |
| KR | 20120098851 | 9/2012 |

(Continued)

*Primary Examiner* — Sheikh Maruf
(74) *Attorney, Agent, or Firm* — Haynes and Boone, LLP

(57) ABSTRACT

A method includes patterning a metal layer to form a plurality of bottom electrode features, forming a Magnetic Tunnel Junction (MTJ) stack by a line-of-sight deposition process such that a first portion of the MTJ stack is formed on the bottom electrode features, and a second portion of the MTJ stack is formed on a level that is different than a top surface of the bottom electrode features, and performing a removal process to remove the second portion of the MTJ stack while leaving the first portion of the MTJ stack substantially intact.

20 Claims, 12 Drawing Sheets

(56) References Cited

U.S. PATENT DOCUMENTS

| | | | |
|---|---|---|---|
| 2009/0059656 A1* | 3/2009 | Kanakasabapathy | H01L 23/544 365/158 |
| 2009/0224341 A1* | 9/2009 | Li | B82Y 25/00 257/421 |
| 2009/0243009 A1* | 10/2009 | Li | G11C 11/5607 257/422 |
| 2010/0109106 A1* | 5/2010 | Zhong | H01L 43/12 257/421 |
| 2010/0193888 A1* | 8/2010 | Gu | H01L 43/08 257/421 |
| 2010/0289098 A1* | 11/2010 | Li | G11C 11/16 257/421 |
| 2011/0062536 A1* | 3/2011 | Min | B82Y 25/00 257/421 |
| 2011/0121417 A1* | 5/2011 | Li | H01L 43/12 257/421 |
| 2011/0204459 A1 | 8/2011 | Gaidis | |
| 2012/0028373 A1* | 2/2012 | Belen | H01L 43/12 438/3 |
| 2012/0032287 A1* | 2/2012 | Li | H01L 43/08 257/421 |
| 2013/0234094 A1 | 9/2013 | Chang et al. | |
| 2013/0244345 A1 | 9/2013 | Li et al. | |
| 2013/0302912 A1* | 11/2013 | Zhong | H01L 43/08 438/3 |
| 2013/0336041 A1 | 12/2013 | Tsai et al. | |
| 2014/0146593 A1 | 5/2014 | Tsai et al. | |
| 2014/0166961 A1 | 6/2014 | Liao et al. | |
| 2014/0175365 A1 | 6/2014 | Chang et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2015/0061051 A1 | 3/2015 | Huang et al. | |
| 2015/0061052 A1 | 3/2015 | Huang et al. | |
| 2015/0069560 A1* | 3/2015 | Cho | H01L 43/02 257/421 |
| 2015/0340596 A1* | 11/2015 | Huang | H01L 43/12 257/421 |
| 2016/0260892 A1* | 9/2016 | Tahmasebi | H01L 43/08 |
| 2016/0268336 A1* | 9/2016 | Shum | H01L 43/12 |
| 2016/0268499 A1* | 9/2016 | You | H01L 43/12 |
| 2016/0351792 A1* | 12/2016 | Jiang | H01L 43/02 |
| 2016/0351797 A1* | 12/2016 | Yi | H01L 43/08 |
| 2017/0025471 A1* | 1/2017 | Bhushan | H01L 27/222 |
| 2017/0025601 A1* | 1/2017 | Bhushan | H01L 43/08 |

FOREIGN PATENT DOCUMENTS

| | | |
|---|---|---|
| KR | 20150026828 | 3/2015 |
| TW | 201133757 | 10/2011 |
| TW | 201508962 | 3/2015 |
| TW | 201537743 | 10/2015 |

* cited by examiner

MAGNETIC TUNNEL JUNCTION WITH REDUCED DAMAGE

CROSS-REFERENCE

This application claims priority to U.S. Provisional Patent Application Ser. No. 62/243,753, filed on Oct. 20, 2015, the entire disclosure of which is hereby incorporated herein by reference.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

One type of feature that may be part of an integrated circuit is a Magnetic Tunnel Junction (MTJ). An MTJ is a device that changes its resistive state based on the state of magnetic materials within the device. An MTJ device includes a thin insulating layer between two ferromagnetic layers. One magnetic layer may be referred to as the reference layer. The other magnetic layer may be referred to as the free layer. The magnetic moment of the reference layer generally maintains the same direction. Conversely, through application of a voltage across the junction, the direction of the magnetic moment of the free layer can be reversed. When the direction of the magnetic moment of both the free layer and the reference layer are the same, electrons can more easily tunnel through the thin insulating layer. In this state, the junction has a relatively low resistivity.

Through application of a voltage with the opposite polarity, the magnetic moment of the free layer can be switched to oppose the direction of the magnetic moment of the reference layer. In this state, it is more difficult for electrons to tunnel through the insulating layer, causing the junction to have a relatively high resistivity. The different resistive states can be used to store logical values. Improvements are desired in this field of endeavor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
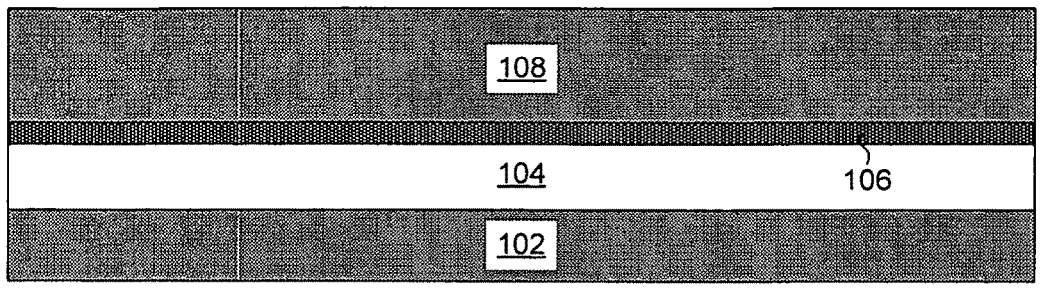
FIGS. 1A, 1B, 1C, 1D, 1E, 1F, 1G, 1H, and 1I are diagrams showing an illustrative process for forming an MTJ by forming dummy features below the real features, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, an MTJ device includes two ferromagnetic layers separated by a very thin dielectric layer so that a current can only flow through the junction by the tunnel effect. The data is saved on the MTJ based on different resistance. When the two ferromagnetic layers are anti-parallel, the resistance R1 is high and represents one state such as 0. While the two ferromagnetic layers are parallel, the resistance R2 is low and represents another state such as 1.

One of the two ferromagnetic layers is pinned to a fixed orientation, referred to as a pinned ferromagnetic layer. The pinning effect is achieved by one or two adjacent pinning layers. Another ferromagnetic layer is free to change its orientation during writing by a polarized current above a certain current level, therefore is referred to as a free layer.

Conventional methods of forming MTJ devices include forming a blanket stack of MTJ layers. The blanket stack may include the reference layer, the insulating layer, the free layer, and the top electrode. The blanket stack may then be patterned using conventional photolithographic techniques. Such photolithographic techniques are followed by etching processes that etch the pattern into the blanket stack. But, such etching may cause damage to the sides of the remaining or resulting features, particularly the MTJ itself.

The methods disclosed here for forming MTJ devices eliminate patterning and etching such features. Using such techniques, the MTJ devices may be substantially damage-free. In one example, a set of bottom electrode features are formed on a substrate. An MTJ stack is then formed on the bottom electrode features using a line-of-sight deposition process. A line-of-sight deposition process is a directional deposition and has no deposition (or no substantial deposition) on sidewalls when it is applied to fill in an opening. The line-of sight deposition process fills in the opening from bottom up and therefore is also referred to as bottom-up deposition process. For example, a physical vapor deposition (PVD) process with higher DC bias will provide a line-of-sight deposition. Here, the line-of-sight deposition process is anisotropic deposition with zero lateral deposition or no substantial lateral deposition, which is further described here. The deposition rate toward the bottom surface (in a direction perpendicular to the top surface of the substrate) is referred to as normal deposition rate $D_n$ and the deposition rate on the lateral (horizontal or parallel to the top surface of the substrate) is referred to as lateral deposition rate $D_r$. The ratio $D_n/D_r$ defines anisotropic behavior of the deposition process. In the present disclosure, a line-of-sight deposition process is a deposition process in which the ratio $D_n/D_r$ is zero or substantially smaller, such as less than 5% or 1%. The bottom electrode features are formed such that when the line-of-sight deposition process occurs, the portions of the MTJ stack that are to be removed are formed on a different level than the portions of the MTJ stack that are to remain. In one example, there are trenches between the bottom electrode features in which the portions of the MTJ stack to be removed are formed. In one example, there are pillars between the bottom electrode features on which the portions of the MTJ stack to be removed are formed. By having the portions of the MTJ stack that are to be removed on a different level than the portions of the MTJ stack that are to remain, portions can be removed without having to etch away MTJ material adjacent to the portions of the MTJ stack that are to remain.

Using principles described herein, damage to the MTJ stack can be substantially reduced or eliminated. This allows for tighter resistance distribution, better power and switching efficiency.

FIGS. 1A, 1B, 1C, 1D, 1E, 1F, 1G, 1H, and 1I are sectional views of a semiconductor structure having a MTJ device at various fabrication stages, in accordance with some embodiments. The MTJ device and the method making the same are collectively described below. FIG. 1A is a diagram showing a substrate 102. In some embodiments, the substrate 102 includes silicon. Alternatively, the substrate 102 may include other elementary semiconductor such as germanium in accordance with some embodiments. In some embodiments, the substrate 102 additionally or alternatively includes a compound semiconductor such as silicon carbide, gallium arsenic, indium arsenide, and indium phosphide. In some embodiments, the substrate 102 includes an alloy semiconductor such as silicon germanium, silicon germanium carbide, gallium arsenic phosphide, and gallium indium phosphide. The substrate 102 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like. In various embodiments, the substrate 102 includes various p-type doped regions and/or n-type doped regions, such as p-type wells, n-type wells, p-type source/drain features and/or n-type source/drain features, formed by a process such as ion implantation and/or diffusion. The substrate 102 may include other functional features such as a resistor, a capacitor, diode, transistors, such as field effect transistors (FETs). The substrate 102 may include lateral isolation features configured to separate various devices formed on the substrate 102. In some embodiments, the MTJ device is formed on or within the interconnection structure. For example, the MTJ device is formed between two adjacent metal layers. In this case, the substrate 102 may further include a portion of an interconnection structure that further includes multiple metal layers and contact features and via features.

A conductive material layer is formed on the substrate 102 and is to be patterned to form a bottom electrode. Other material layer(s) might be additionally deposited for various fabrication considerations. In the illustrated embodiment, a dielectric layer 104, a capping layer 106, and a bottom electrode layer 108 are deposited on the substrate 102, respectively, as illustrated in FIG. 1A.

The dielectric layer 104 may be formed by depositing a dielectric material on the substrate 102. The dielectric layer 104 may be made of a variety of dielectric materials, such as silicon dioxide ($SiO_2$), silicon oxynitride, low k dielectric material or a combination thereof. The formation of the dielectric layer 104 may include spin-on coating, chemical vapor deposition (CVD), other suitable technique or a combination thereof.

The capping layer 106 may then be deposited onto the dielectric layer 104. The capping layer 106 may be made of material that is designed for one or more functions, such as preventing diffusion of the metal within the bottom electrode layer 108 into the dielectric layer 104 or the substrate 102. The capping layer 106 may additionally or alternatively have other function, such as functioning as an etching stop layer and thus be substantially resistant to various etching processes. The capping layer 106 may include a dielectric material different from that of the dielectric layer 104. In one example, the barrier layer 106 may be made of silicon nitride ($Si_3N_4$), formed by a suitable technique, such as CVD or PVD. Other types of materials are contemplated as well.

The bottom electrode layer 108 may be made of a variety of conductive materials such as metal or metal alloy materials. For example, the bottom electrode layer 108 may be made of copper (Cu), tungsten (W), aluminum (Al), titanium (Ti), tantalum (Ta), or other suitable conductive material(s) or layered combination thereof. The bottom electrode layer 108 may be deposited by a suitable technique, such as physical vapor deposition (PVD), plating or a procedure that includes forming a seed layer by PVD and then plating to form the bottom electrode layer on the seed layer.

Figure 1B:
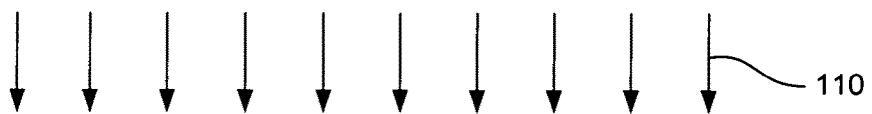
Figure 1B:
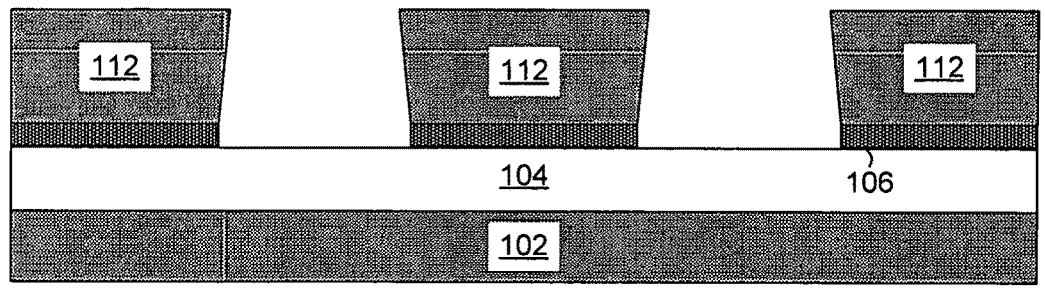

FIG. 1B is a diagram showing an illustrative patterning process 110 to pattern the bottom electrode layer 108 to form bottom electrode features 112. In one example, the patterning process 110 involves forming a patterned photoresist layer on the bottom electrode layer 108 by a lithography process and etching the bottom electrode layer 108 using the patterned photoresist layer as an etch mask. A lithography process may include coating, exposure and developing. The photoresist layer is coated on the bottom electrode layer 108 by a suitable process, such as spin-on coating. The photoresist layer is then exposed to a light source through a photomask. The exposed photoresist layer is then developed to form the patterned photoresist layer. The lithography process may further include one or more baking process, such as soft baking, post exposure baking and hard baking. The lithography process may alternatively include other technique, such as electron-beam direct writing, or maskless lithography. Alternatively, a hard mask may be used as an etch mask. In this case, a hard mask layer is deposited between the bottom electrode layer 108 and the photoresist layer; the photoresist layer is patterned by the lithography process, and an etching process is applied to the hard mask to transfer the pattern from the patterned photoresist layer to the hard mask layer.

The etching process may include dry etch, wet etch or both. In one example, the etching process may be a reactive ion etching (RIE) process.

In some examples, the patterning process 110 may be designed to create an undercut profile for the bottom electrode features 112. As illustrated in FIG. 1B, the bottom electrode features 112 are formed such that the top is wider than the bottom. The undercut profile may be achieved by adjusting the angle of the directional etching process that is used to remove portions of the bottom electrode layer 108. In some examples, however, the bottom electrode features 112 may be formed with a substantially straight profile. In such cases, the sidewalls of the bottom electrode features 112 may be substantially perpendicular to the substrate 102.

Figure 1C:
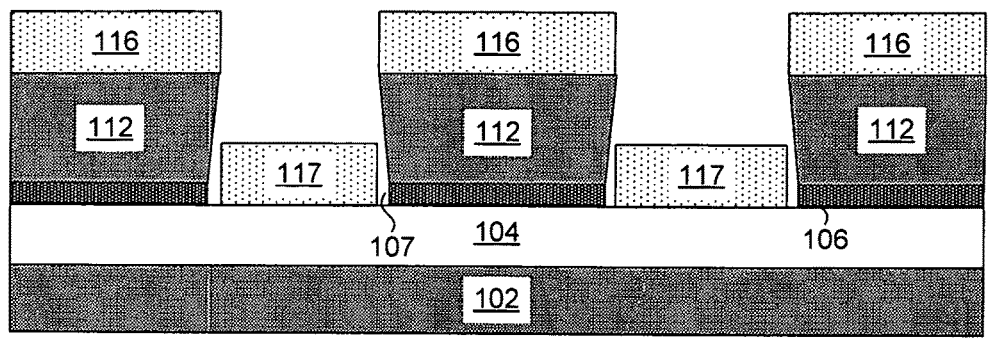

FIG. 1C is a diagram showing an illustrative light-of-sight process 114 for forming an MTJ stack 116, 117. In the present embodiment, the MTJ stack by the line-of-sight deposition has no (or substantially no) deposition of MTJ materials on the exposed bottom electrode sidewalls. As will be described in further detail below, the MTJ stack 116, 117 includes a plurality of layers. Specifically, forming the MTJ stack includes forming a pinning layer, a first ferromagnetic layer, an insulating layer, a second ferromagnetic layer, and a top electrode letter. In one example, the MTJ stack 116, 117 is formed using a line-of-sight deposition process, such as PVD with DC bias high enough so that no lateral deposition. Thus, the MTJ stack 116, 117 is not formed on sidewalls of the bottom electrode features 112. The deposition process 114 creates a first portion 116 of the MTJ stack on top of the bottom electrode features 112 and a second portion 117 of the MTJ stack adjacent to the bottom electrode features 112. In other words, the second portion 117 is formed within the trenches between the bottom electrode features 112 and on the dielectric layer 104 and/or any remaining portions of the barrier layer 106. The line-of-sight deposition process 114 and the undercut profile illustrated in FIG. 1C results in a gap 107 between the second portion 117 of the MTJ stack and the bottom electrode features 112. The first portion 116 represents a set of real features formed on top of the bottom electrode features 112. The second portion 117 represents a set of dummy features (sacrificial). The dummy features are referred to as such because they will eventually be removed, as will be described in further detail below.

Figure 1D:
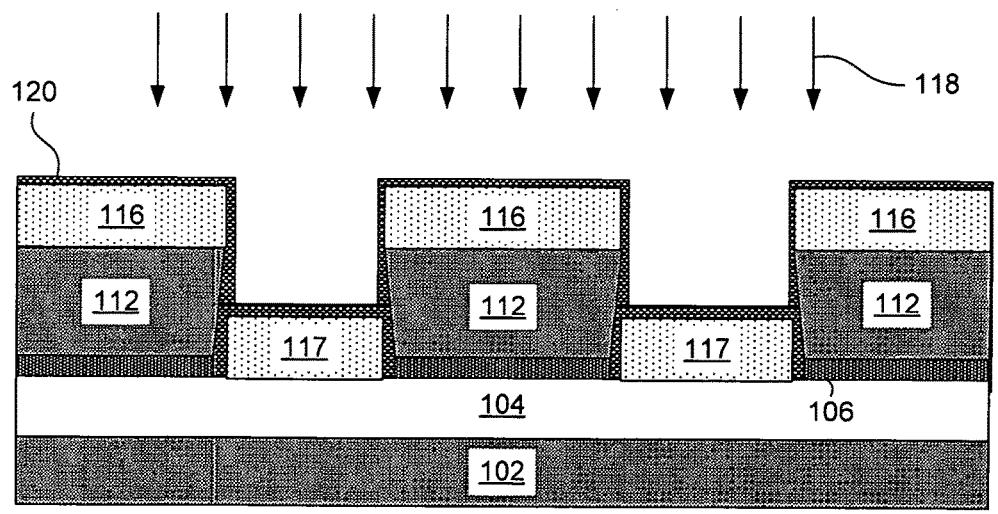

FIG. 1D is a diagram representing a deposition process 118 to form a protection layer for the sidewalls of MTJ features 116 and also to serve as an etch-stop layer 120. The deposition process 118 may include, for example, an atomic layer deposition (ALD) process or chemical vapor deposition (CVD) process. Other suitable processes may be used as well. The etch-stop layer may be made of a variety of materials such as silicon carbide, silicon nitride, or other suitable material film(s). Such materials are designed to be substantially resistant to various etching processes. In the present example, the etch-stop layer 120 is also formed in the gaps between the bottom electrode features 112 and the dummy features 117 of the MTJ stack and protects the first portion 116 from subsequent etching.

Figure 1E:
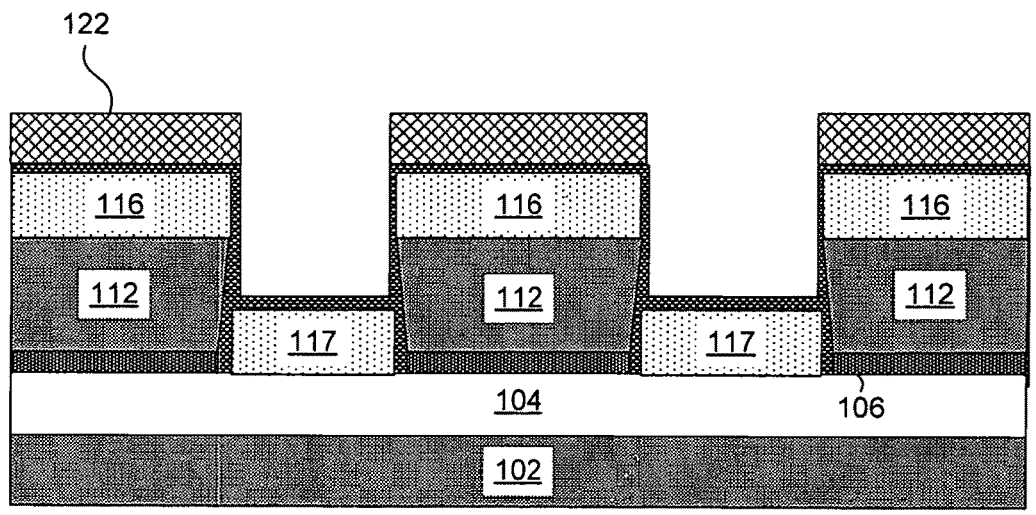

FIG. 1E is a diagram showing a patterned mask 122 formed on top of the real features 116 of the MTJ stack. In one example, the mask 122 may be a patterned photoresist layer formed by a lithography process. Alternatively, the patterned mask 122 may be a hard mask formed by a procedure that includes depositing a hard mask layer (such as silicon oxide or silicon nitride), forming a pattern photoresist layer on the hard mask layer, and transferring the pattern from the patterned photoresist layer to the hard mask layer by etch.

Figure 1F:
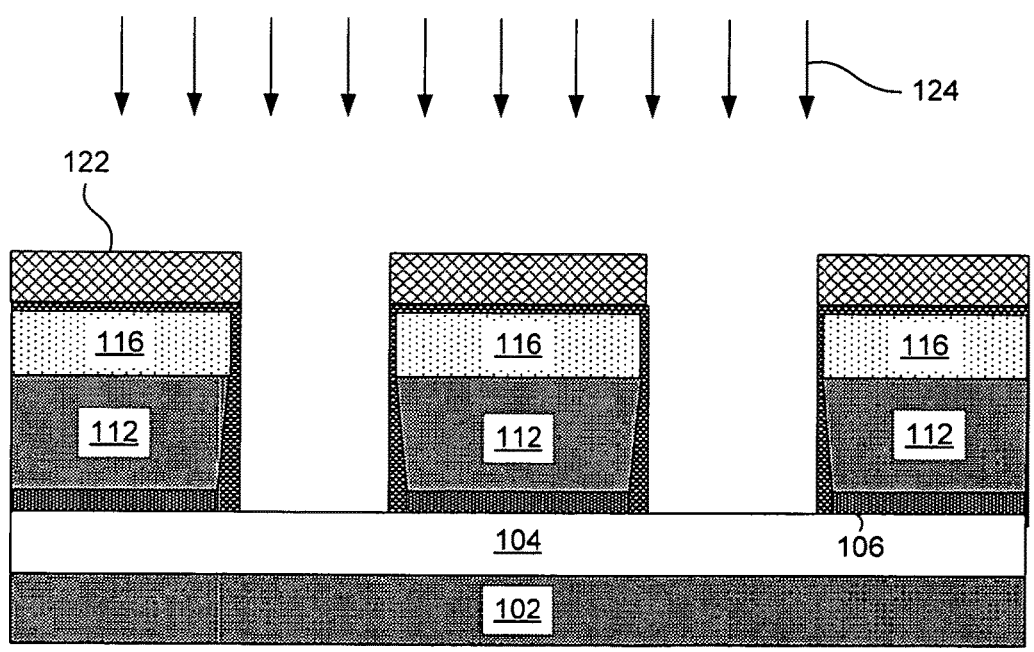

FIG. 1F is a diagram showing illustrative removal process 124 to remove the dummy features 117. In the present example, the mask 122 protects the real features 116 from the removal process 124. Thus, only the dummy features 117 are removed because they are exposed to the removal process 124. In one example, the removal process 124 is an etching process. For example, the removal process 124 may be a reactive ion etching process.

Figure 1G:
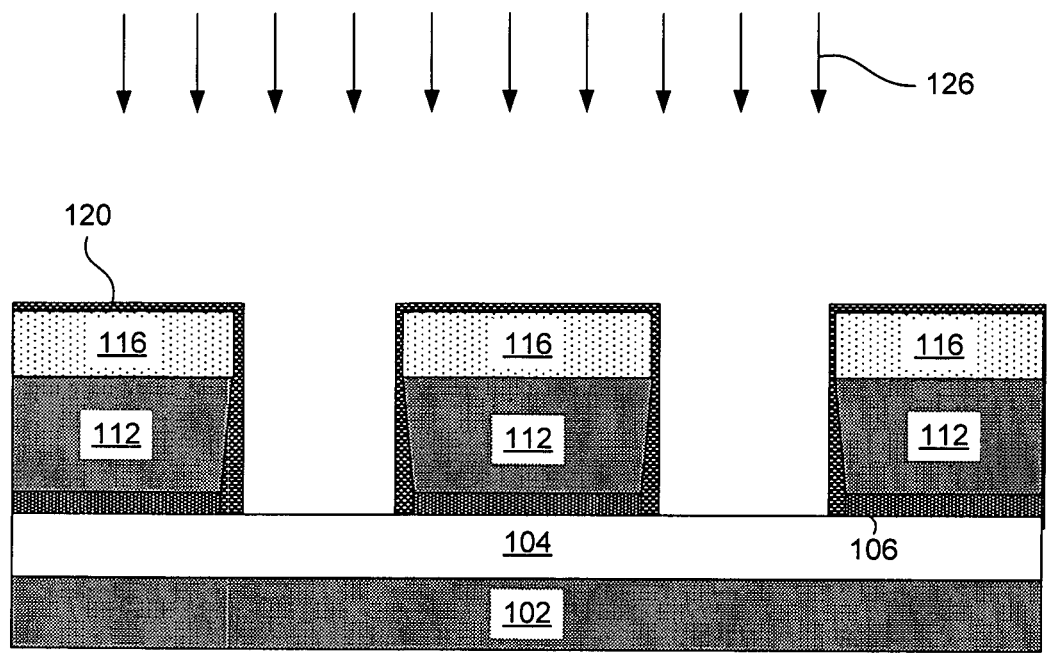

FIG. 1G illustrates a removal process 126 to remove the mask 122. The removal process 126 may be a wet etching process or dry etching process. The removal process 126 may be designed to selectively remove the mask 122 while leaving the remaining features substantially intact. MTJ features 116 are therefore etch-damage free due to the nature of the line-of-sight MTJ deposition process and subsequent protection of 116 features by protection layer 120 throughout subsequent patterning and removal processes.

Figure 1H:
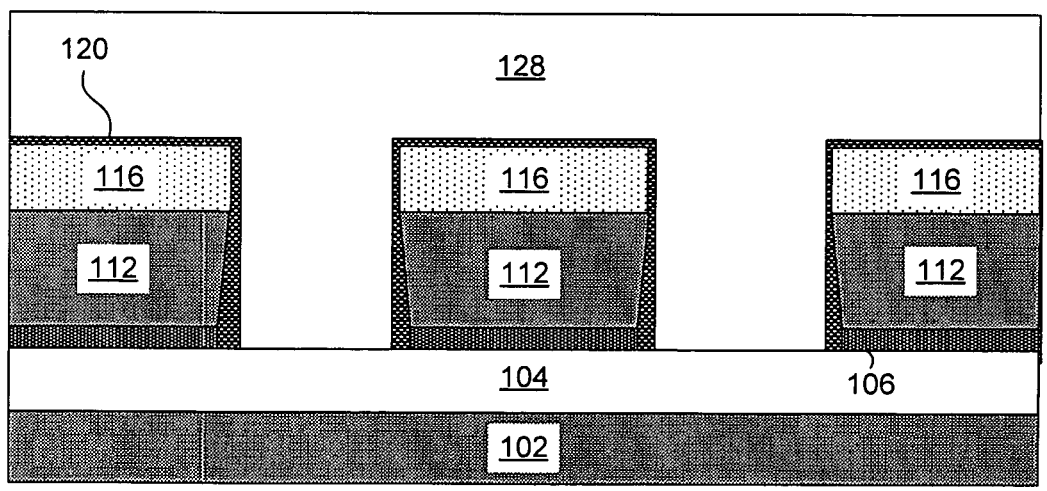

FIG. 1H is a diagram showing illustrative dielectric layer 128 disposed on the real features 116 of the MTJ stack. In some examples, the material used for the dielectric layer 128 may be the same as the material used for dielectric layer 104. The dielectric layer 128 covers both the top and sides of the real features 116 of the MTJ stack. Additionally, the dielectric layer 120 fills the space between the bottom electrode features 112. For example, the dielectric layer 128 may include silicon oxide, low k dielectric material, other suitable dielectric material or a combination thereof. The method to form the dielectric layer may include a suitable deposition technique, such as CVD, or a procedure that include spin-on coating and curing. The method may further include a chemical mechanic polishing (CMP) to planarize the top surface.

Figure 1I:
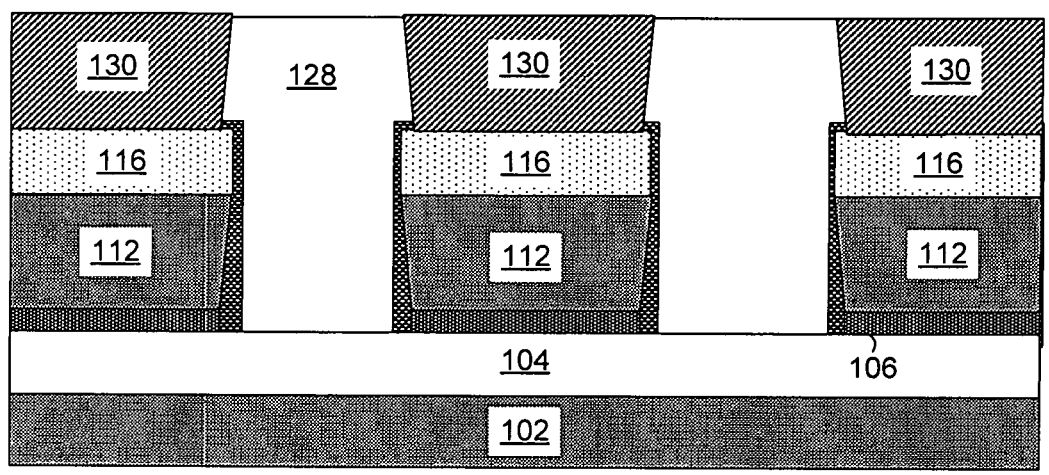

FIG. 1I is a diagram showing contact features 130 formed within the dielectric layer 128. The contact features 130 provide an electrical connection between the top layer of the real features 116 of the MTJ stack and other portions of the circuit. Subsequent layers may be formed on top of the contact features 130 to provide conductive interconnect routing for the circuit. The contact features 130 are formed by a suitable procedure similar to the procedure used to form contact features or via features of the interconnection structure.

The formation of the contact features 130 is described below according to example. Contact holes are formed through the dielectric layer 128 to expose the top layer of the real features 116 of the MTJ stack using a patterning process that includes lithography process and etching. A conductive material is deposited onto the substrate to fill in the contact holes by a suitable technique, such as one or more PVD depositions. The conductive material may include metal or metal alloy, such as copper, aluminum or tungsten, and may additionally include a liner layer, such as titanium nitride and titanium. A planarizing process such as a CMP process may then be used to planarize the top surface of the substrate.

In other embodiments, the contact features are collectively formed by a process to form one metal layer or one via layer of the interconnect structure, such as damascene process or dual damascene process.

Figure 2A:
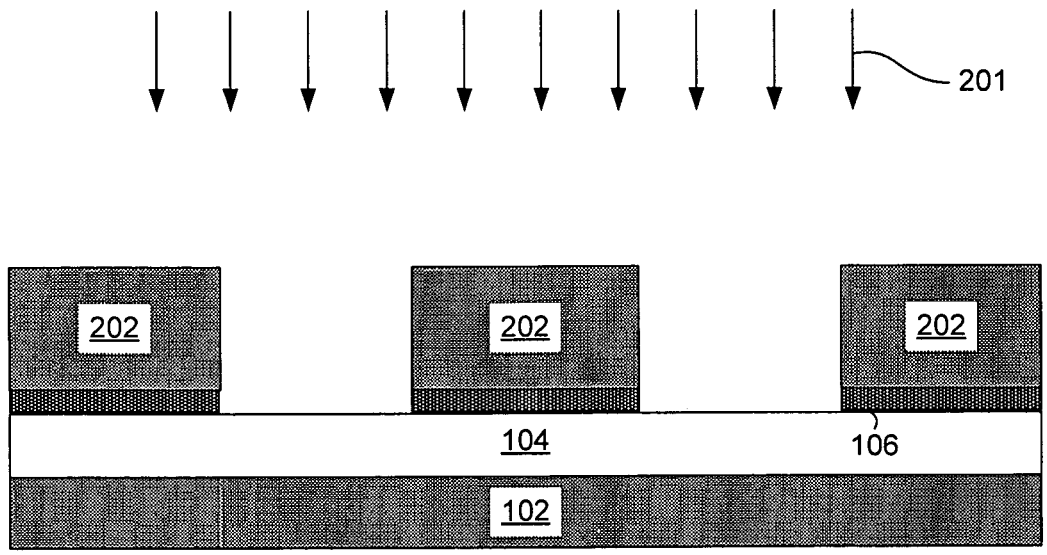
FIGS. 2A, 2B, 2C, 2D, 2E, 2F, 2G, and 2H are diagrams showing an illustrative process for forming an MTJ device by forming dummy features above the real features, according to one example of principles described herein.

FIGS. 2A, 2B, 2C, 2D, 2E, 2F, 2G, and 2H are diagrams showing an illustrative process for forming an MTJ device by forming dummy features above the real features. FIG. 2A illustrates a patterning process 201 to pattern the bottom electrode layer to form a plurality of bottom electrode features 202. The patterning process 201 may be similar to the patterning process 110 described above or other state of the art patterning schemes. In the present example, the patterning process 201 is designed to create a substantially straight profile. Specifically, the sidewalls of the bottom electrode features 202 are substantially perpendicular to the substrate 102.

Figure 2B:
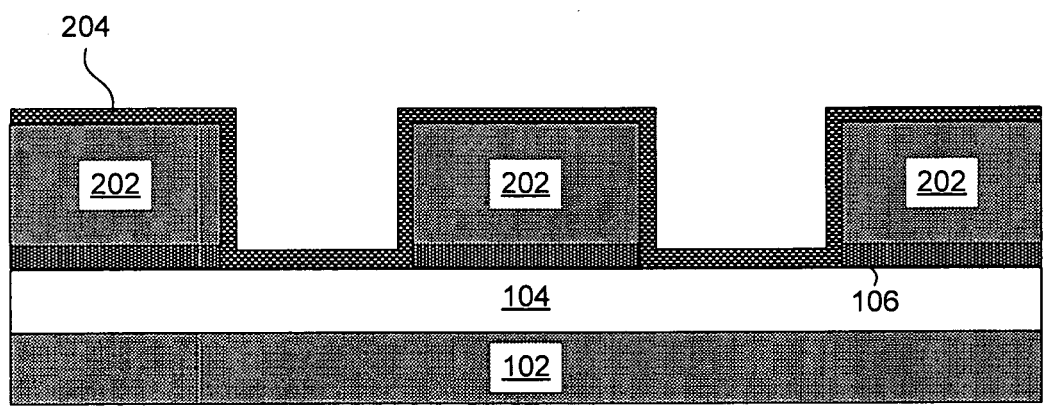

FIG. 2B is a diagram showing deposition of an etch-stop layer 204 onto the bottom electrode features 202. The etch-stop layer 204 is deposited on the top surfaces of the bottom electrode features 202 as well as the sidewalls of the bottom electrode features 202. The etch-stop layer 204 is also deposited along the surface of the dielectric layer 104 between the bottom electrode features 202. The etch-stop layer 204 may be made of a dielectric material such as silicon nitride, silicon oxide or silicon oxynitride. Other suitable materials may be used as well.

Figure 2C:
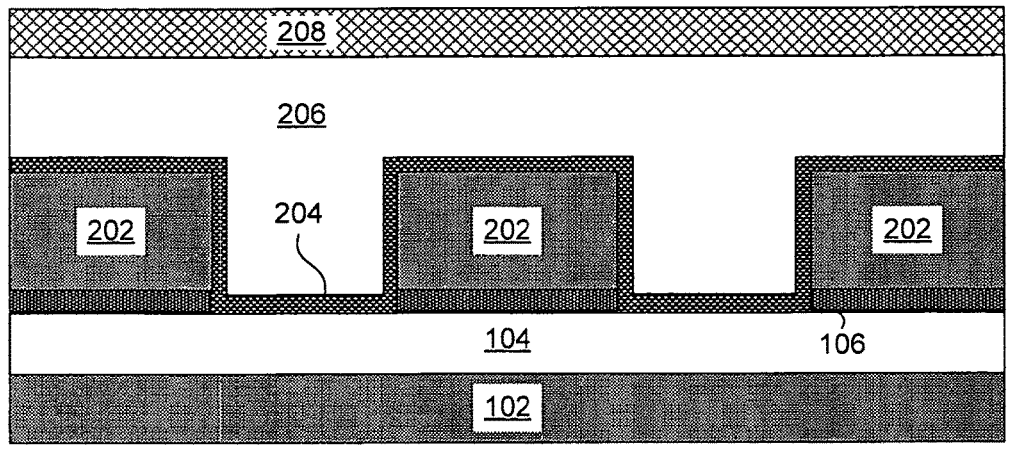

FIG. 2C is a diagram showing deposition of an additional dielectric layer 206 and a hard mask layer 208. The dielectric layer 206 may include any suitable dielectric material and may include more than one layer, deposited by a suitable technique, such as CVD or spin-on coating. In some examples, the dielectric layer 206 may be made of the same type of material as dielectric layer 104. A CMP may be additionally applied to the dielectric layer to planarize the top surface. The hard mask layer 208 is deposited onto the dielectric layer 206 and is used to pattern the dielectric layer 206. The hard mask may include a material different from that of the dielectric layer 206 for subsequent etching selectivity. For example, the dielectric layer 206 includes silicon oxide or low k dielectric material and the hard mask layer 208 includes silicon nitride.

Figure 2D:
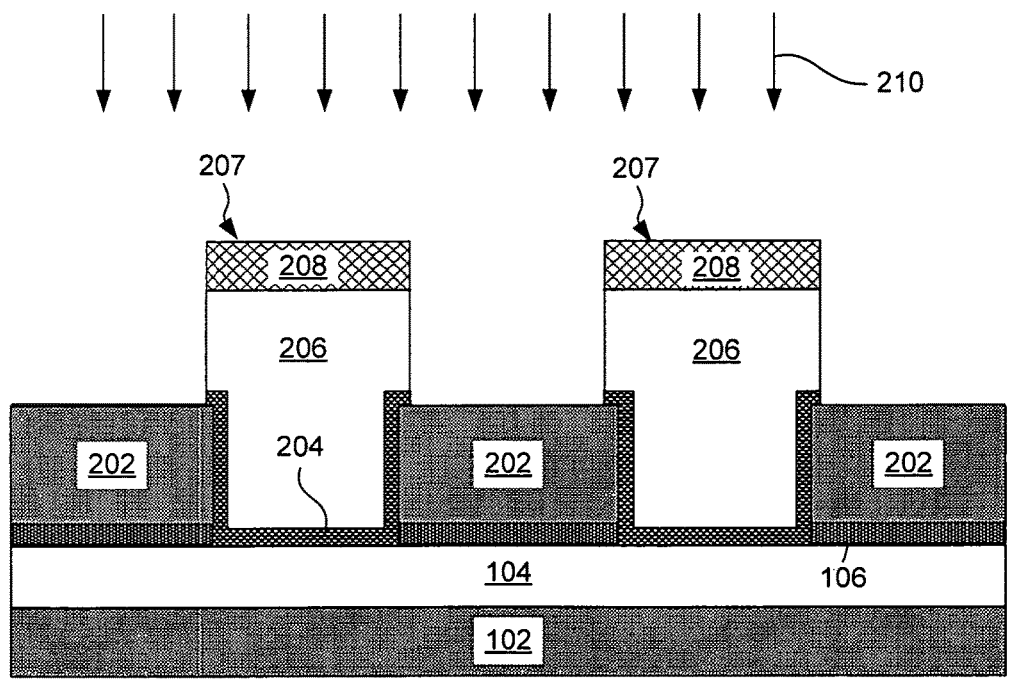

FIG. 2D is a diagram showing an illustrative removal process 210 to expose the bottom electrode features 202. For example, the hard mask layer 208 may be patterned to expose the regions of the dielectric film above the bottom electrode features 202. The hard mask layer 208 may be patterned using photolithographic techniques as described above. The removal process 210 may be an etching process, particularly, a dry etching process. After the removal process 210, a set of pillars 207 remain between the bottom electrode features 202. In the present example, the patterning process 210 is designed to create pillars with substantially straight profiles or slightly re-entrant profiles (opening dimension between two neighbor pillars is slightly larger when measured near the top surface of 202 compared to the opening dimension at top of pillar's dielectric 206). Specifically, the sidewalls of the pillar features 207 are substantially perpendicular to the substrate 102.

Figure 2E:
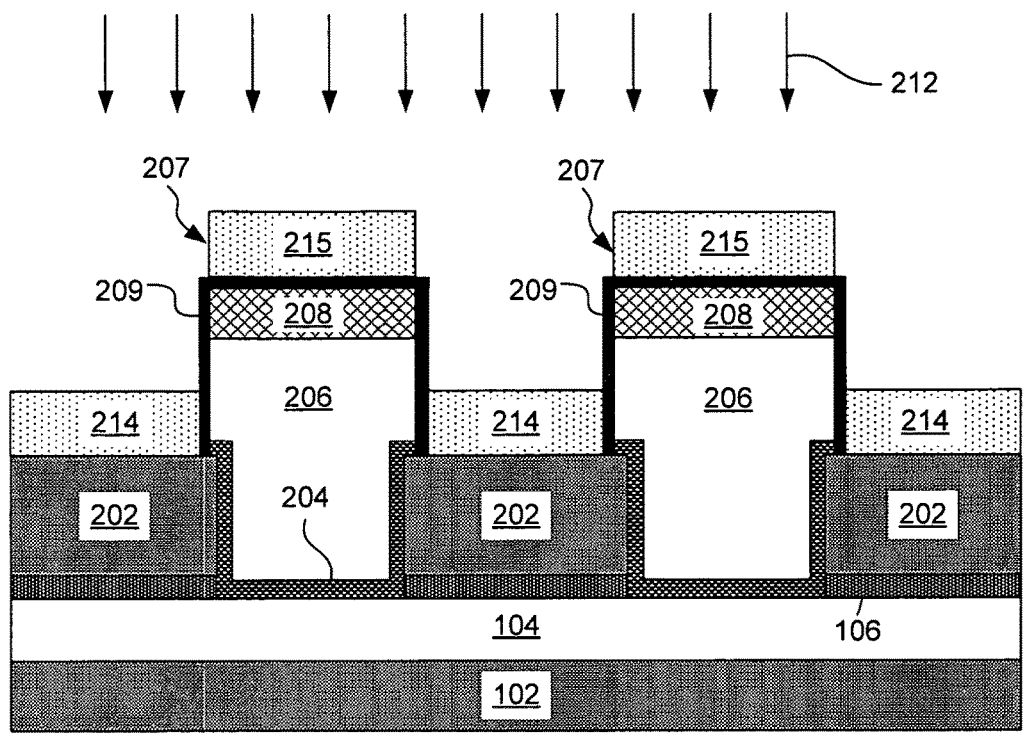

FIG. 2E illustrates formation of a spacer 209 and a line-of-sight deposition process 212 to form the MTJ stack. The spacer 209 may be made of a dielectric material. The thickness of the spacer 209 may be selected to also adjust or control the size of the MTJ stacks 214 that will be formed on the bottom electrode features 202.

The deposition process 212 may be similar to the deposition process 114 described above. The deposition process 212 includes multiple deposition steps to deposit respective films of the MTJ stacks. In various examples, spacer deposition steps may include one or more deposition technique, such as CVD, PVD, atomic layer deposition (ALD) or other deposition technique designed to deposit conformal spacer 209 followed by a line-of-sight deposition process of the MTJ films. The MTJ deposition in process 212 creates a first set of MTJ features 214 on the bottom electrode features 202 and a second set of MTJ features 215 on top of the pillars 207. In one example, the MTJ features 214, 215, are formed using a line-of-sight deposition process. Thus, the MTJ stacks 214, 215 are not formed on sidewalls of the pillars 207. Because the pillars 207 are present, the deposition process 212 results in the second set of MTJ features 215 being formed on a different level than the first set of MTJ features 214. The first set of MTJ features 214 may be referred to as real features because they will serve a function in the final structure. The second set of MTJ features 215 may be referred to as dummy features and will subsequently be removed.

Figure 2F:
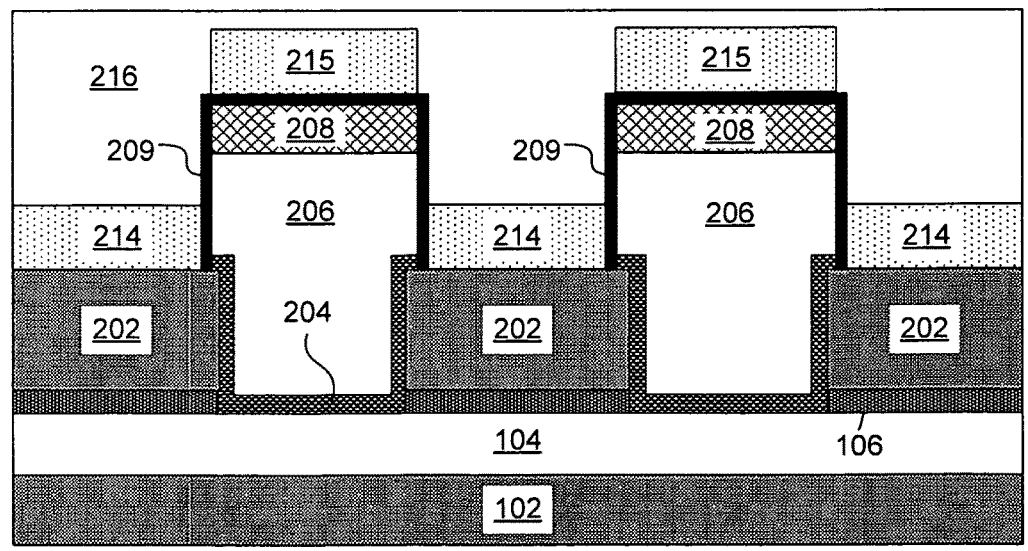

FIG. 2F is a diagram showing deposition of an additional dielectric layer 216. The dielectric layer 216 is formed on top of both the first set of MTJ features 214 and the second set of MTJ features 215. The dielectric layer thus 216 fills the gaps between the pillars 207. The dielectric layer 216 may be made of the same type of material used to form other dielectric layers such as dielectric layer 206 and dielectric layer 104.

Figure 2G:
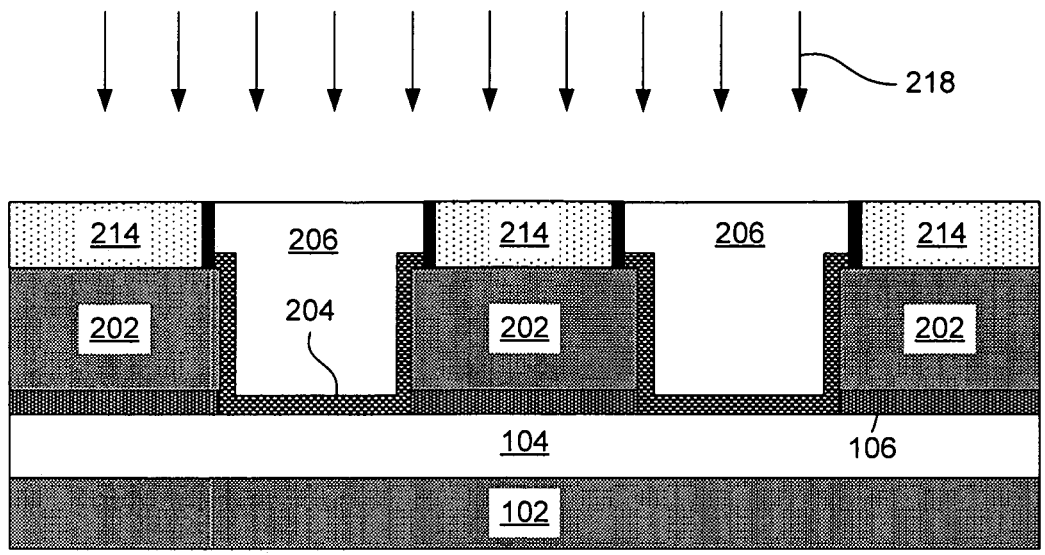

FIG. 2G illustrates a planarization process 218 that removes the dummy features 215. In one example, the planarization process 218 is a CMP process. The CMP process is applied to both remove the dummy features 215 and expose the top surfaces of the real features 214. Thus, portions of the originally deposited MTJ stack that are not intended to be used with an MTJ device are removed without having to pattern and etch the deposited MTJ stack. Thus, damage to the sides of the MTJ features 214 is substantially eliminated as these features will not undergo or be subject to any etching process throughout the fabrication process.

Figure 2H:
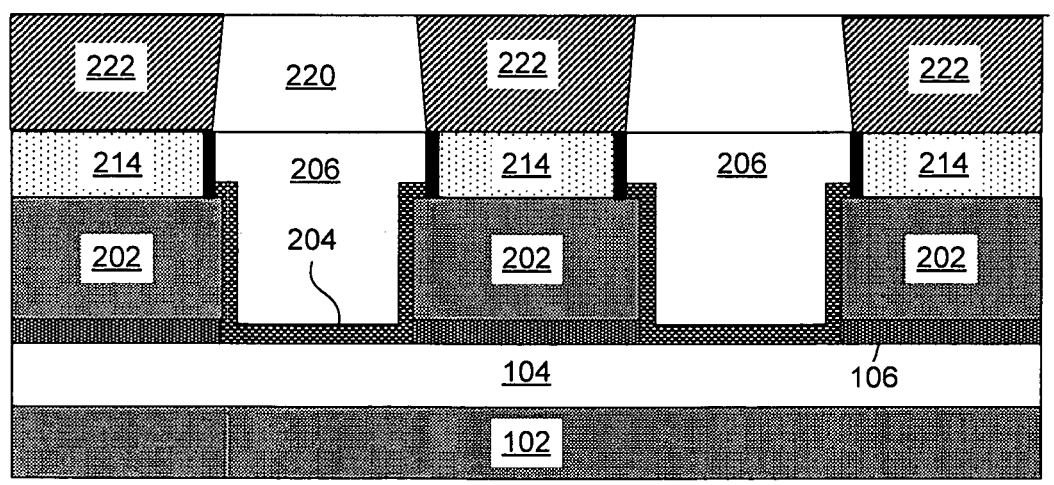

FIG. 2H is a diagram showing an additional dielectric layer 220 and contacts 222 formed therein. In one example, the dielectric layer 220 is first deposited to cover the real features 214 and the exposed portions of the dielectric layer 206. The dielectric layer 220 may be made of the same type of material as dielectric layer 206. In some examples, however, different dielectric materials may be used.

After the dielectric layer 220 has been deposited, it may be patterned to form contact holes therein. The dielectric layer 220 may be patterned using a patterning process that include lithographic process and etching. The patterning process may be similar to the previous patterning processes, such as a patterning process to form contact holes in FIG. 1I. After the contact holes are formed, the contact holes may be filled with a metal material to form the contacts 222. Then, a CMP process may be performed to planarize the surface of the wafer and expose portions of the dielectric layer 220. The procedure to form the contacts 220 is similar to the procedure to form the contacts 130 in FIG. 1I.

Figure 3:
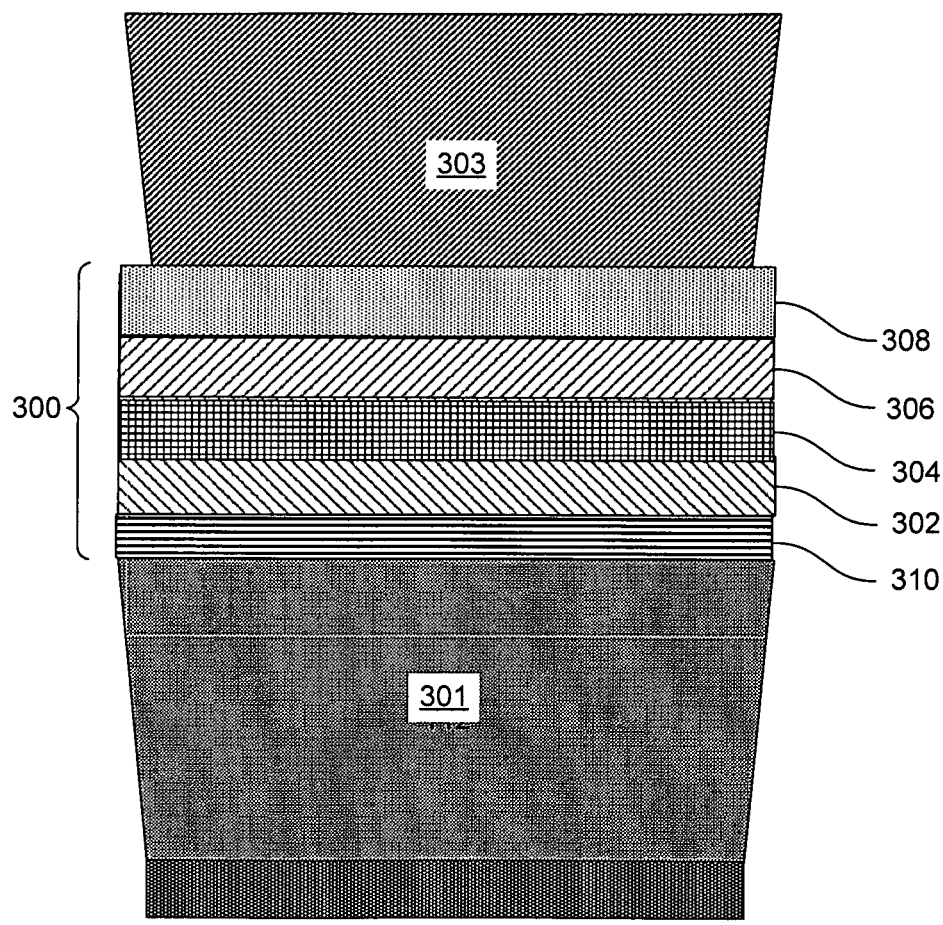
FIG. 3 is a diagram showing illustrative layers of the MTJ stack, according to one example of principles described herein.

FIG. 3 is a diagram showing illustrative layers of the MTJ stack 300. According to the present example, the MTJ stack 300 is positioned between a bottom electrode feature 301 and a contact 303. The bottom electrode feature 301 may correspond to the bottom electrode features 112, 202 described above. The contact 303 may correspond to the contacts 130, 222 described above. The MTJ stack 300 may correspond to the real features 116, 214 that are formed by the deposition processes 114, 212 described above.

As described above, the MTJ stack 300 includes a plurality of layers including a pinning layer 310, a first ferromagnetic layer 302, an insulating layer 304, a second ferromagnetic layer 306, and the top electrode 308. The first ferromagnetic layer 302 may also be referred to as a fixed layer, a reference layer, or a pinned layer. The second ferromagnetic layer 306 may also be referred to as a free layer. In some examples, the MTJ stack 300 may not include the top electrode layer 308. Instead, the function of the top electrode 308 may be performed by the contact 303. In an alternative structure, the free layer may be placed below the tunnel barrier and the pinned and associated antiferromagnetic layers may be placed above the tunnel barrier In some embodiments, the pinning layer 310 is a layer of anti-ferromagnetic (AFM) material. Anti-ferromagnetic materials are those in which the magnetic moments of atoms or molecules align such that a pattern is formed wherein neighboring atoms or molecules have spins pointing in opposite directions. The pinning layer 310 may be made of a variety of materials, including, but not limited to, platinum manganese (PtMn), iridium manganese (IrMn), rhodium manganese (RhMn) and iron manganese (FeMn). Such material may be deposited using various deposition techniques such as Plasma Vapor Deposition (PVD).

The first ferromagnetic layer 302, or pinned layer, has a magnetic moment that is "pinned" in a particular direction by the anti-ferromagnetic pinning layer 310. Thus, the first ferromagnetic layer 302 does not change its magnetic moment during operation of the MTJ device. The first ferromagnetic layer 302 may be made of a variety of materials, including, but not limited to, CoFeB, CoFeTa, NiFe, Co, CoFe, CoPt, CoPd, FePt, or other alloys of Ni, Co and Fe. Such material may be deposited using various deposition techniques such as PVD.

The insulating layer 304 may be formed of an electrically resistive material, such as an oxide material. In the present example, the insulating layer 304 is made of magnesium oxide (MgO). In alternative examples, the insulating layer 304 may include magnesium (Mg), MgO, aluminum oxide (AlO), aluminum nitride (AlN), aluminum oxynitride (AlON), other suitable materials, or a combination thereof. The insulating layer 304 may be formed through suitable deposition methods such as PVD. The insulating layer 304 may range in thickness from about 5 angstroms to about 15 angstroms.

The second ferromagnetic layer 306, or free layer, is also made of a ferromagnetic material. Unlike the first ferromagnetic layer 302, the magnetic moment direction of the free layer 306 can change under various conditions during operation of the MTJ device because there is no pinning layer adjacent to the free layer 306.

In some examples, a top electrode layer 308 is deposited onto the free layer 306. According to certain illustrative examples, the top electrode 308 may be made of a suitable conductive material. Such materials include, but are not limited to, titanium (Ti), tantalum (Ta), platinum (Pt) or ruthenium (Ru). The top electrode layer 308 may be formed using a physical vapor deposition (PVD or sputtering) or another suitable process.

When the magnetic moment of the free layer 306 is the same direction as the magnetic moment of the reference layer 302, electrons can more readily tunnel through the insulating layer 304. This causes the MTJ to be in a relatively low resistive state. Thus, with a properly polarized voltage applied, an electric current can flow through the MTJ stack 300 between the bottom electrode feature 301 and the contact 303.

With an oppositely polarized voltage applied, the direction of the magnetic moment of the free layer 108 can be set to oppose the direction of the magnetic moment of the reference layer 104. In this state, it is more difficult for electrons to tunnel through the insulating layer 304. This causes the MTJ to be in a high resistive state. The different resistive states may be used to represent digital values. For example, the high resistive state may be used to represent a digital '0' while the low resistive state may be used to represent a digital '1'.

Figure 4:
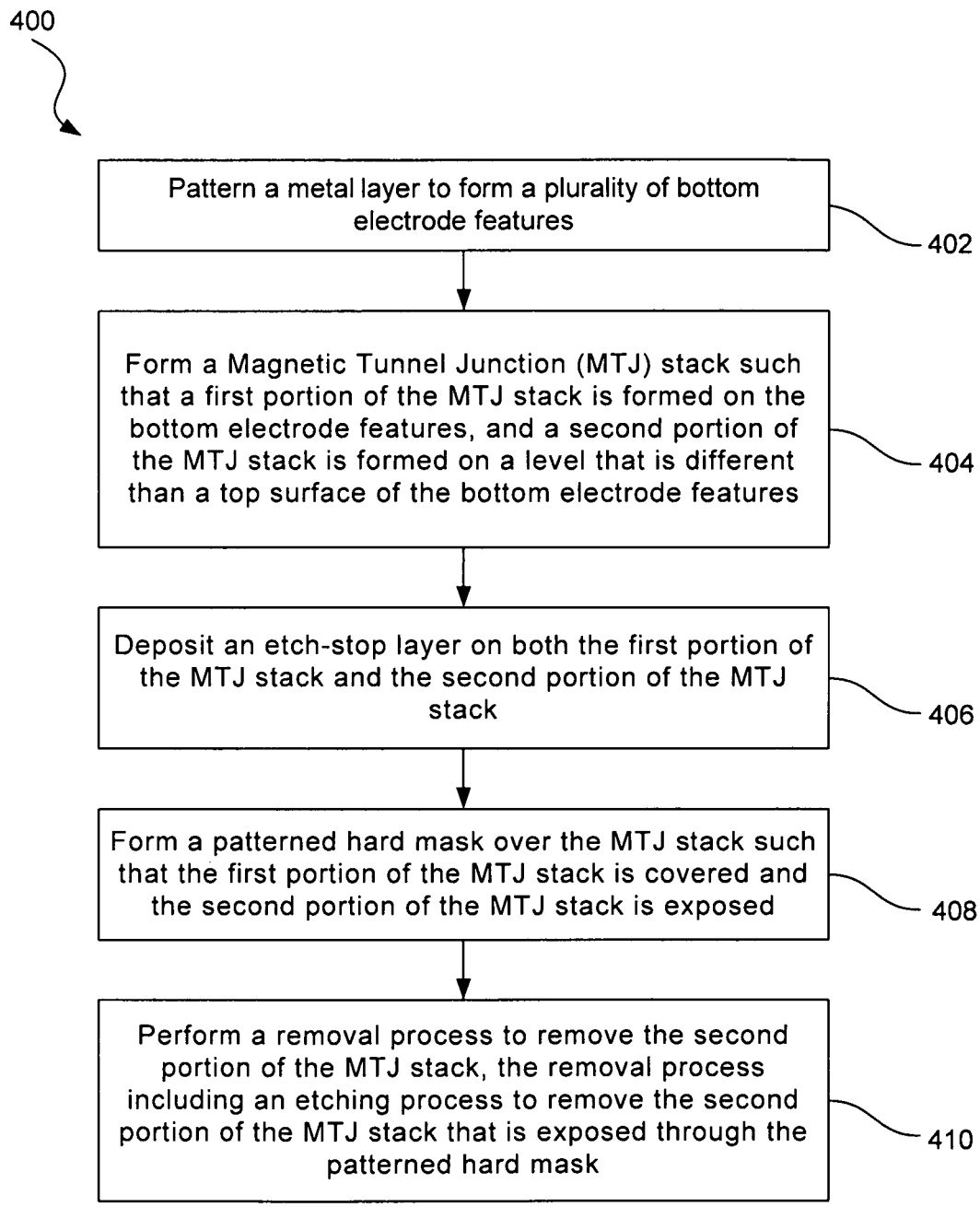
FIG. 4 is a flowchart showing illustrative method for forming an MTJ device by forming dummy features below the real features, according to one example of principles described herein.

FIG. 4 is a flowchart showing illustrative method for forming an MTJ device by forming dummy features below the real features, in accordance with some embodiments. According to the present example, the method 400 includes an operation 402 for patterning a metal layer to form a plurality of bottom electrode features. The bottom electrode features may be patterned using various photolithographic techniques.

The method 400 further includes an operation 404 for forming an MTJ stack by a line-of-sight deposition such that a first portion of the MTJ stack is formed on the bottom electrode features, and a second portion (sacrificial portion) of the MTJ stack is formed on a level that is different than a top surface of the bottom electrode features and no substantial deposition of MTJ materials occurs on the sidewalls of bottom electrode features. For example, the second portion of the MTJ stack may be formed within trenches between the bottom electrode features as shown in FIG. 1C. Thus, the second portion (sacrificial portion) of the MTJ stack is formed on a level that is lower than the top surface of the bottom electrode features.

The method 400 further includes an operation 406 for depositing an etch-stop layer on both the first portion of the MTJ stack and the second portion of the MTJ stack. The second portion of the MTJ stack corresponds to the dummy features 117 described above. The etch-stop layer may also be formed in gaps between the bottom electrode features and the dummy features.

The method 400 further includes an operation 408 for forming a patterned hard mask over the MTJ stack such that the first portion of the MTJ stack is covered and the second portion of the MTJ stack is exposed. The patterned hard mask may be performed by depositing a material onto the wafer and then patterning that material using various photolithographic techniques.

The method 400 further includes an operation 410 for performing a removal process to remove the second portion of the MTJ stack, the removal process including an etching process to remove the second portion of the MTJ stack that is exposed through the patterned hard mask. The removal process 410 thus removes only the dummy features without having to etch the dummy features away from the real features as would be the case if the dummy features and real features were formed on a single level as a continuous single layer.

Figure 5:
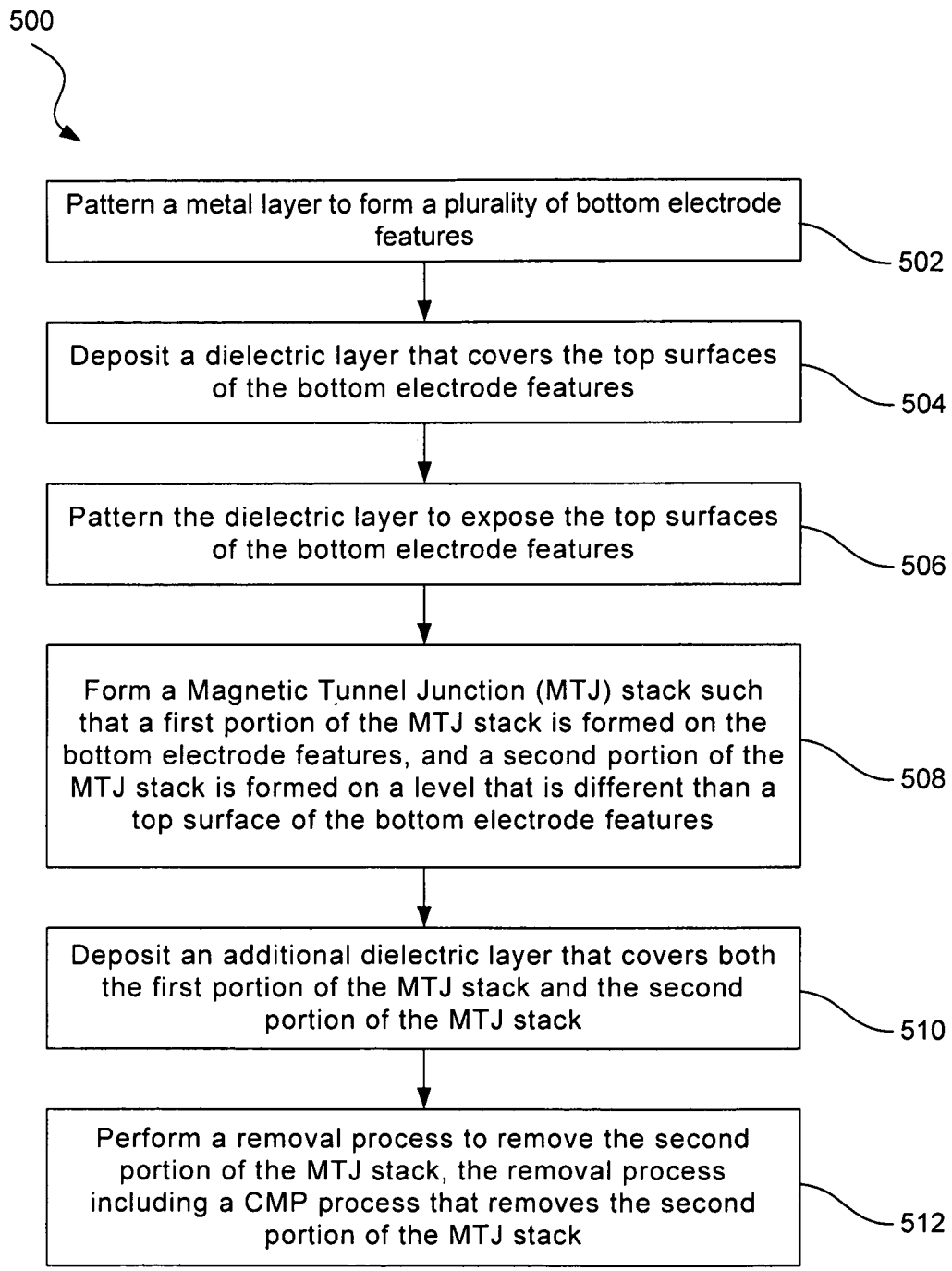
FIG. 5 is a flowchart showing an illustrative method for forming an MTJ device by forming dummy features above the real features, according to one example of principles described herein.

FIG. 5 is a flowchart showing an illustrative method for forming an MTJ device by forming dummy (sacrificial) features above the real features in accordance with some embodiments. According to the present example, the method 500 includes an operation 502 for patterning a metal layer to form a plurality of bottom electrode features. The bottom electrode features may be patterned using various photolithographic techniques.

The method 500 further includes an operation 504 for depositing a dielectric layer that covers the top surfaces of the bottom electrode features. The dielectric layer also feels the gaps between the bottom electrode features.

The method 500 further includes an operation 506 for patterning the dielectric layer to expose the top surfaces of the bottom electrode features. This creates a series of pillars positioned between the bottom electrode features.

The method 500 further includes an operation 508 for forming an MTJ stack by a line-of-sight deposition such that a first portion of the MTJ stack is formed on the bottom electrode features, and a second portion of the MTJ stack is formed on a level that is different than a top surface of the first portion of the MTJ stack. Specifically, the second portion of the MTJ stack is formed on top of the pillars that are positioned between the bottom electrode features. Thus, the second portion of the MTJ stack is formed on a level that is higher than the top surface of the bottom electrode features. MTJ stack by a line-of-sight deposition process has no substantial deposition of MTJ materials on the pillar sidewalls.

The method 500 further includes an operation 510 for depositing an additional dielectric layer that covers both the first portion of the MTJ stack and the second portion of the MTJ stack. Thus, the additional dielectric layer fills gaps between the pillars and above the real MTJ features formed on the bottom electrode features.

The method 500 further includes an operation 512 for performing a removal process to remove the second portion of the MTJ stack, the removal process including a CMP process that removes the second portion of the MTJ stack. In other words, the wafer is polished down until the second portions of the MTJ stack, which are formed on the pillars, are completely removed and the top layer of the first portions of the MTJ stack are exposed.

Using principles described herein, MTJ devices may be formed without having to directly pattern an MTJ stack layer as done in conventional techniques. Thus, damage to the MTJ stack can be substantially reduced or eliminated. This allows for a lower operating current range to be used which allows the device to operate with better power efficiency and improved memory or retention characteristics.

According to one example, a method includes patterning a metal layer to form a plurality of bottom electrode features, forming a Magnetic Tunnel Junction (MTJ) stack such that a first portion of the MTJ stack is formed on the bottom electrode features, and a second portion of the MTJ stack is formed on a level that is different than a top surface of the bottom electrode features, and performing a removal process to remove the second portion of the MTJ stack while leaving the first portion of the MTJ stack substantially intact.

According to one example, a method including patterning a metal layer to form a plurality of bottom electrode features, forming a Magnetic Tunnel Junction (MTJ) stack using a line-of-sight deposition process such that a first set of MTJ features are formed on top surfaces of the bottom electrode features, and a second set of MTJ features on a level that is different than the top surfaces of the bottom electrode features, and performing a removal process to remove the second set of MTJ features while leaving the first set of MTJ features substantially intact.

According to one example, a device includes a plurality of bottom electrode features disposed on a substrate. The device further includes Magnetic Tunnel Junction (MTJ) stacks disposed on the bottom electrode features. The MTJ stacks include a fixed layer, a barrier layer, a free layer, and a top electrode layer. The device further includes an etch-stop layer formed on sidewalls of the bottom electrode features and along the substrate between the bottom electrode features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   patterning a metal layer to form a plurality of bottom electrode features;
   forming a first etch-stop layer on top and side surfaces of the bottom electrode features;
   forming a Magnetic Tunnel Junction (MTJ) stack by a line-of-sight deposition process such that a first portion of the MTJ stack is formed on the bottom electrode features, and a second portion of the MTJ stack is formed on a level that is different than a top surface of the bottom electrode features; and
   performing a removal process to remove the second portion of the MTJ stack while leaving the first portion of the MTJ stack substantially intact.

2. The method of claim 1, further comprising:
   depositing a dielectric layer on the first portion of the MTJ stack; and
   forming contacts within the dielectric layer that connect to the first portion of the MTJ stack.

3. The method of claim 1, wherein the level is lower than the top surface of the bottom electrode features.

4. The method of claim 3, further comprising, after forming the MTJ stack and before performing the removal process, depositing a second etch stop layer on both the first portion of the MTJ stack and the second portion of the MTJ stack.

5. The method of claim 4, further comprising forming a patterned hard mask over the MTJ stack such that the first portion of the MTJ stack is covered and the second portion of the MTJ stack is exposed.

6. The method of claim 5, wherein the removal process comprises an etching process to remove the second portion of the MTJ stack that is exposed through the patterned hard mask.

7. The method of claim 1, wherein the level is higher than the top surface of the bottom electrode features.

8. The method of claim 7, further comprising, before forming the MTJ stack, depositing a dielectric layer that covers the top surfaces of the bottom electrode features.

9. The method of claim 8, further comprising, before forming the MTJ stack, patterning the dielectric layer to form trenches within the dielectric layer to expose the top surfaces of the bottom electrode features.

10. The method of claim 9, wherein the level is a top surface of the dielectric layer.

11. The method of claim 10, further comprising, after forming the MTJ stack, depositing an additional dielectric layer that covers both the first portion of the MTJ stack and the second portion of the MTJ stack.

12. The method of claim 11, wherein the removal process comprises Chemical Mechanical Planarization (CMP) process that removes the second portion of the MTJ stack and causes a top surface of the dielectric layer to be coplanar with the top surface of the first portion of the MTJ stack.

13. The method of claim 1, wherein forming the MTJ stack comprises:
   forming a fixed layer;
   forming a barrier layer on the fixed layer;
   forming a free layer on the barrier layer; and
   forming a top electrode layer on the free layer.

14. A method comprising:
   patterning a metal layer to form a plurality of bottom electrode features;
   forming a first etch-stop layer on top and side surfaces of the bottom electrode features;
   forming a Magnetic Tunnel Junction (MTJ) stack using a line-of-sight deposition process such that a first set of MTJ features are formed on top surfaces of the bottom electrode features, and a second set of MTJ features on a level that is different than the top surfaces of the bottom electrode features; and
   performing a removal process to remove the second set of MTJ features while leaving the first set of MTJ features substantially intact.

15. The method of claim 14, wherein the level is lower than the top surfaces of the bottom electrode features, the method further comprising:
   after forming the MTJ stack and before performing the removal process, depositing a second etch stop layer on both the first set of MTJ features and the second set of MTJ features;
   forming a patterned hard mask over the MTJ stack such that the first set of MTJ features is covered and the second set of MTJ features is exposed; and
   performing the removal process by etching the second portion of the MTJ stack that is exposed through the patterned hard mask.

16. The method of claim 14, wherein the level is higher than the top surfaces of the bottom electrode features, the method further comprising:
   before forming the MTJ stack, depositing a dielectric layer that covers the top surfaces of the bottom electrode features;
   before forming the MTJ stack, patterning the dielectric layer to expose the top surfaces of the bottom electrode features;
   after forming the MTJ stack, depositing an additional dielectric layer that covers both the first portion of the MTJ stack and the second portion of the MTJ stack; and
   performing the removal process by using a Chemical Mechanical Planarization (CMP) process to remove the second set of MTJ features.

17. The method of claim 14, wherein forming the MTJ stack comprises:
   forming a first ferromagnetic layer;
   forming an insulator layer on the first ferromagnetic layer;
   forming a second ferromagnetic layer on the insulator layer; and
   forming a top electrode layer on the second ferromagnetic layer.

18. A method comprising:
   forming a plurality of bottom electrode features on a substrate;
   forming an etch-stop layer on top and side surfaces of the bottom electrode features;
   forming Magnetic Tunnel Junction (MTJ) stacks on the bottom electrode features, the MTJ stacks comprising:
      a fixed layer;
      a barrier layer;
      a free layer; and
      a top electrode layer; and
   forming an etch-stop layer on sidewalls of the bottom electrode features and along the substrate between the bottom electrode features.

19. The method of claim 18, further comprising forming a spacer on sidewalls of the MRT stacks, the spacer being formed directly above one of the bottom electrode features.

20. The method of claim 18, further comprising, forming a dielectric feature adjacent the etch-stop layer and the spacer layer, a top surface of the dielectric layer being substantially co-planar with a top surface of the MTJ stack.

* * * * *